United States Patent [19]
Kumagai

[11] Patent Number: 6,008,510
[45] Date of Patent: *Dec. 28, 1999

[54] SILICON ON INSULATOR MASTER SLICE SEMICONDUCTOR INTEGRATED CIRCUIT

[75] Inventor: Kouichi Kumagai, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/865,328

[22] Filed: May 29, 1997

[30] Foreign Application Priority Data

May 30, 1996 [JP] Japan ................................. 8-136702

[51] Int. Cl.⁶ .................................................. H01L 27/105
[52] U.S. Cl. ............................................ 257/204; 257/350
[58] Field of Search ................................. 257/347, 350, 257/202–211

[56] References Cited

U.S. PATENT DOCUMENTS

| | | | |
|---|---|---|---|
| 4,253,162 | 2/1981 | Hollingsworth | 257/350 |
| 4,725,875 | 2/1988 | Hsueh | 257/350 |
| 5,298,773 | 3/1994 | Woodruff | 257/204 |
| 5,317,181 | 5/1994 | Tyson | 257/347 |
| 5,501,989 | 3/1996 | Takayama et al. | 257/350 |
| 5,633,524 | 5/1997 | Ueda et al. | 257/205 |
| 5,635,744 | 6/1997 | Hidaka et al. | 257/206 |

FOREIGN PATENT DOCUMENTS

| | | |
|---|---|---|
| 0 690 510 A1 | 1/1996 | European Pat. Off. . |
| 1-246861 | 10/1989 | Japan . |
| 4-241452 | 8/1992 | Japan . |

OTHER PUBLICATIONS

Patent Abstracts of Japan, Yasunori, vol. 16, No. 324, 1992—04–096369.
Patent Abstracts of Japan, Masami, vol. 16, No. 332, 1992—04–099059.
Patent Abstracts of Japan, Yoshinari et al., vol. 11, No. 390, 1987—62–154663.
Patent Abstracts of Japan, Kenji et al., vol. 7, No. 174, 1983—58–078456.

*Primary Examiner*—David B. Hardy
*Attorney, Agent, or Firm*—Foley & Lardner

[57] ABSTRACT

A master slice semiconductor IC has a SOI substrate and a plurality of basic cells arranged in a matrix on the SOI substrate. The basic cell includes a two-input NAND gate and a diode forward biased between one of power supply lines and the NAND gate. The diode has a P-N junction extending between the top surface of a semiconductor layer and the insulator layer underlying the semiconductor layer. The diode reduces the supply voltage by the forward drop voltage thereof to reduce power consumption in the NAND gate, and the SOI structure of the basic cell prevents reduction of integration density and operational speed.

8 Claims, 10 Drawing Sheets

SILICON ON INSULATOR MASTER SLICE SEMICONDUCTOR INTEGRATED CIRCUIT

BACKGROUND OF THE INVENTION (a) Field of the Invention

The present invention relates to a master slice semiconductor integrated circuit (IC) and, more particularly, to a master slice semiconductor IC wherein a gate array or standard cells are formed on a silicon on insulator (SOI) substrate.

(b) Description of the Related Art

The application specific IC (generally referred to as ASIC) is increasingly used in the art. FIG. 1 shows a typical ASIC in a plan view wherein the CMOS SOG (a gate array) has a plurality of basic cells each implemented as a two-input NAND gate. FIGS. 2A and 2B are sectional views taken along E—E and F—F lines, respectively, in FIG. 1, and FIG. 3 is an equivalent circuit diagram for the basic cell in FIG. 1. Each basic cell 401 has an N-well contact region 402, P-well contact region 407, a pair of PMOS transistors 416a and 416b including P+-diffused regions 403a, 403b and 403c and pMOS gate electrodes 405a and 405b, and a pair of nMOS transistors 417a and 417b including N+-diffused regions 404a, 404b and 404c and nMOS gate electrodes 406a and 406b.

Source potential (Vdd) is applied to N-well contact region 402 and P+-diffused regions 403a and 403c via source line 408 and contact hole. Ground potential is applied to P-well contact region 407 and N+-diffused regions 404a via ground line 409 and contact hole 412. The common drain 403b of the pair of parallel pMOS transistors 416a and 416b having sources 403a and 403c connected to source lines is coupled via output line 411 to the drain 404c of one of serial nMOS transistors 417a and 417b, namely nMOS transistor 417b, having a source maintained at the ground potential. A pMOS gate electrode 495a is coupled to nMOS gate electrode 406a via input line 418, PMOS gate electrode 405b is coupled to nMOS gate electrode 406b via input line 419 to thereby constitute the two-input NAND gate. The basic cell in a conventional CMOS SOG is generally implemented as a two-input NAND gate in this manner or a two-input NOR gate. Input lines 418 and 419 are implemented by a first layer aluminum alloy film and connected to interconnects implemented by a second layer aluminum alloy film not shown in the drawings.

With the advance of CMOS ASIC technology to a higher speed and a higher integration, the basic cell as shown in FIG. 1 has been developed toward a finer pattern. In addition, a technique for reducing power consumption is especially required for the CMOS ASIC in view of the wide use of portable communication systems. This technology greatly increases the continuous use of portable communication systems that operate with a battery.

Power consumption P(watt) in the CMOS logic circuit is expressed in terms of operating frequency f(Hz), source voltage Vdd(volts) and load capacitance C(farad) as follows:

$$P = 0.5 \times C \times f \times Vdd^2 \quad (1)$$

As understood from equation (1), the power consumption is proportional to a square of the source voltage, and reduction of power consumption is most effectively achieved by reduction of the source voltage. The reduction of the source voltage in an internal circuit can be achieved by a circuit configuration using a forward voltage drop of a diode as described in, for example, Patent Publication No. JP-A-01-246861. FIG. 4A shows a circuit arrangement in a plan view wherein the technique described in the publication is directed to the basic cell shown in FIG. 1. FIGS. 4B and 4C are circuit arrangements wherein the technique is applied to a source line and a ground line, respectively, for the basic cell.

In FIG. 4B, source voltage Vdd is applied, while reducing the same by a forward drop voltage of diode 502a, to CMOS inverter including pMOS transistor 516a and nMOS transistor 517a. Specifically, N+-diffused region 504b and nMOS gate electrode 506a of a basic cell 501 are coupled to source line 508, and P-well contact region 521 is coupled to ground line 509, thereby implementing the diode 502a. Further, pMOS gate electrode 505f and nMOS gate electrode 506d of the adjacent basic cell are coupled by input line 510a, N-well contact region 520 is coupled to source line 508, P+-diffused region 503i is coupled to N+-diffused region 504a via line 527a, N+-diffused region 504f is coupled to ground line 509, and P+-diffused region 503h is coupled to N+-diffused region 504e via output line 511a, thereby implementing a CMOS converter. The configuration that pMOS gate electrode 505e is coupled to source line 508 and nMOS gate 506c to ground line 509 prevents the channels underlying these gate electrodes from conducting, which might otherwise occur due to the potential of output line 511a.

Similarly, as shown in FIG. 4C, diode 502b implemented by a pMOS transistor and interposed between the CMOS inverter and ground line also reduces power consumption in the CMOS inverter. Specifically, P+-diffused region 503a of a basic cell is coupled to pMOS gate electrode 505b thereof via ground line 509, and N-well contact region 520 is coupled to source line 508, thereby implementing diode 502b. Further, pMOS gate electrode 505c and nMOS gate electrode 506e of the adjacent basic cell are coupled together via input line 510b, P-well contact region 521 is coupled to ground line 509, P+-diffused region 503c is coupled to N+-diffused 504g region via line 527b, P+-diffused region 503d is coupled to source line 508, P+-diffused region 503e is coupled to N+-diffused region 504h via output line 511b, and P+-diffused region 503e is coupled to N+-diffused region 504h via output line 511b, thereby implementing a CMOS inverter. The configuration that pMOS gate electrode 505d is coupled to source line 508, and nMOS gate electrode 506f to ground line 509 prevents the channel regions underlying these gate electrodes conducting, which might otherwise occur due to the potential of output line 511b.

As described above, although a low power consumption can be realized in the CMOS basic cell formed on a bulk substrate, the CMOS basic cell used in this purpose also reduces the integration density of the ASIC due to use of the additional basic cell. In addition, the P-N junction between the source region of the nMOS transistor or pMOS transistor implementing the diode and the P-well or N-well, which is maintained at the ground potential or source potential for reverse biasing, can retard a high speed operation. In addition, the large parasitic capacitance requires a large charge/discharge current, which impedes the reduction of power consumption.

Another method for reduction of source voltage is to incorporate a devoted P-N junction into a basic cell. FIG. 5A shows such a configuration wherein a twin-well CMOS process is effected to a P-type bulk substrate to layout a mixture of a CMOS transistor and a diode having an anode or cathode which is neither maintained at a source potential nor ground potential in the substrate and coupled to the circuit by metallic lines. FIG. 5B is a circuit diagram wherein diode 602a is interposed between a source line and a CMOS inverter, FIG. 5C is a circuit diagram wherein diode 602b is interposed between ground line and a CMOS inverter, and FIGS. 6A and 6B are cross-sectional views taken along G—G and H—H lines, respectively.

FIGS. 6A and 6B show the diode formed in the N-well 622a adjacent to PMOS transistors and the diode formed in the P-well 623a adjacent to nMOS transistors, respectively. The diodes have cathodes implemented by N$^+$-diffused regions 604d and 604e in N-well 622b and 622d and anodes implemented by P$^+$-diffused regions 603d and 603e. The P-type silicon substrate is maintained at the ground potential.

In FIG. 6A, a pair of PMOS transistors are implemented by N-well contact region 620, P$^+$-diffused regions 603a, 603b and 603c, and pMOS gate electrodes 605a and 605b. N-well 622a for the pair of pMOS transistors is applied with source potential via source line 608, contact hole 612 and N-well contact region 620. P-well 623c is provided to separate N-well 622a from N-well 622b maintained at the same potential as the cathode of the diode.

In a current CMOS transistor process using a 0.5 μm design rule in gate length, the width for P-well 623c is about 2 μm at a minimum. It is also necessary to secure the distance between P-well 623c and the anode of the diode implemented by P$^+$-diffused region 603d at about 1 μm and the distance between P-well 623c and N-well contact region 620 at about 1 μm. Accordingly, the separation region for the diode should have width about 4 μm around the diode, which reduces the integration density of the IC.

The diode shown in FIGS. 5a and 6a has cathodes implemented by N$^+$-diffused regions 604d and N-well 622b. The parasitic capacitance associated with the cathode is a sum of the P-N junction capacitances between the same and P$^+$-diffused region 603d constituting the anode, between the same and P-wells 623c and 623d, and between the same and P-substrate 613. The large parasitic capacitance of the cathode consumes a larger power during the potential change thereof compared to the source or drain region of the MOS transistor provided that the cathode and source or drain region occupy an identical amount of area.

In FIG. 6B, the pair of nMOS transistors are implemented by P-well contact region 621, N$^+$-diffused regions 604a, 604b and 604c, and nMOS gate electrodes 606a and 606b. P-well 623a for the pair of nMOS transistors is maintained at the ground potential by ground line 609, contact hole 612 and P-well contact region 621. In this case, a separating region similar to the separation region for the diode is provided for assuring the rectangular area for the basic cell arranged in a matrix, although the separating region is not required to have a constant width such as required for the separation region in FIG. 6A.

In addition, the parasitic capacitance associated with the cathode terminal in FIG. 6B is a sum of P-N junction capacitances between the same and P$^+$-diffused region 603e constituting the anode, between the same and P-well 623a, 623b and 623c and between the same and P-substrate 613, similarly to the case of FIG. 6A.

The large capacitance of the cathode terminal requires a larger power consumption during the potential change thereof compared to the case of source or drain region provided that the cathode and source or drain region occupy an identical amount of area. In short, the use of a diode basic cell for the CMOS basic cell is inferior to the use of CMOS basic cell itself in integration density, operational speed and power consumption.

SUMMARY OF THE INVENTION

It is an object of the present invention to provide a master slice semiconductor IC capable of reduction of power consumption with less reduction of integration density and operational speed.

The present invention provides a master slice semiconductor IC comprising a substrate having a silicon on insulator (SOI) area including an insulator layer and a semiconductor layer formed on the insulator layer, a separating layer for separating the semiconductor layer into a plurality of cell regions, a basic cell disposed in each of the cell regions, a pair of power supply lines for supplying power to each cell region, the basic cell including a functional cell portion and a first diode forward biased between one of the power supply lines and the functional cell portion, the first diode having an anode and a cathode defining therebetween a first P-N junction extending between a top surface of the semiconductor layer and the insulator layer.

In the master slice semiconductor IC according to the present invention, the basic cell may include, in addition to the P-N junction diode, at least one pMOS transistor and at least one nMOS transistor. In this case, the P-N junction may have an anode formed in common with a source or drain of a pMOS transistor or a cathode formed in common with a source or drain of an nMOS transistor.

The basic cell may have a first and a second diode interposed between source line and the functional cell portion and between the functional cell portion and ground line. The anode or cathode of a the diode may be implemented by the source of pMOS transistor or an nMOS transistor. The functional cell portion may be any of a NAND gate, NOR gate or CMOS transistor etc.

In accordance with the present invention, the SOI substrate, which does not have a well region, can be separated only by a field oxide layer and can be supplied with power without using a contact region. Accordingly, reduction of power consumption can be obtained with less reduction of integration density and operational speed.

PREFERRED EMBODIMENTS OF THE INVENTION

Figure 7:
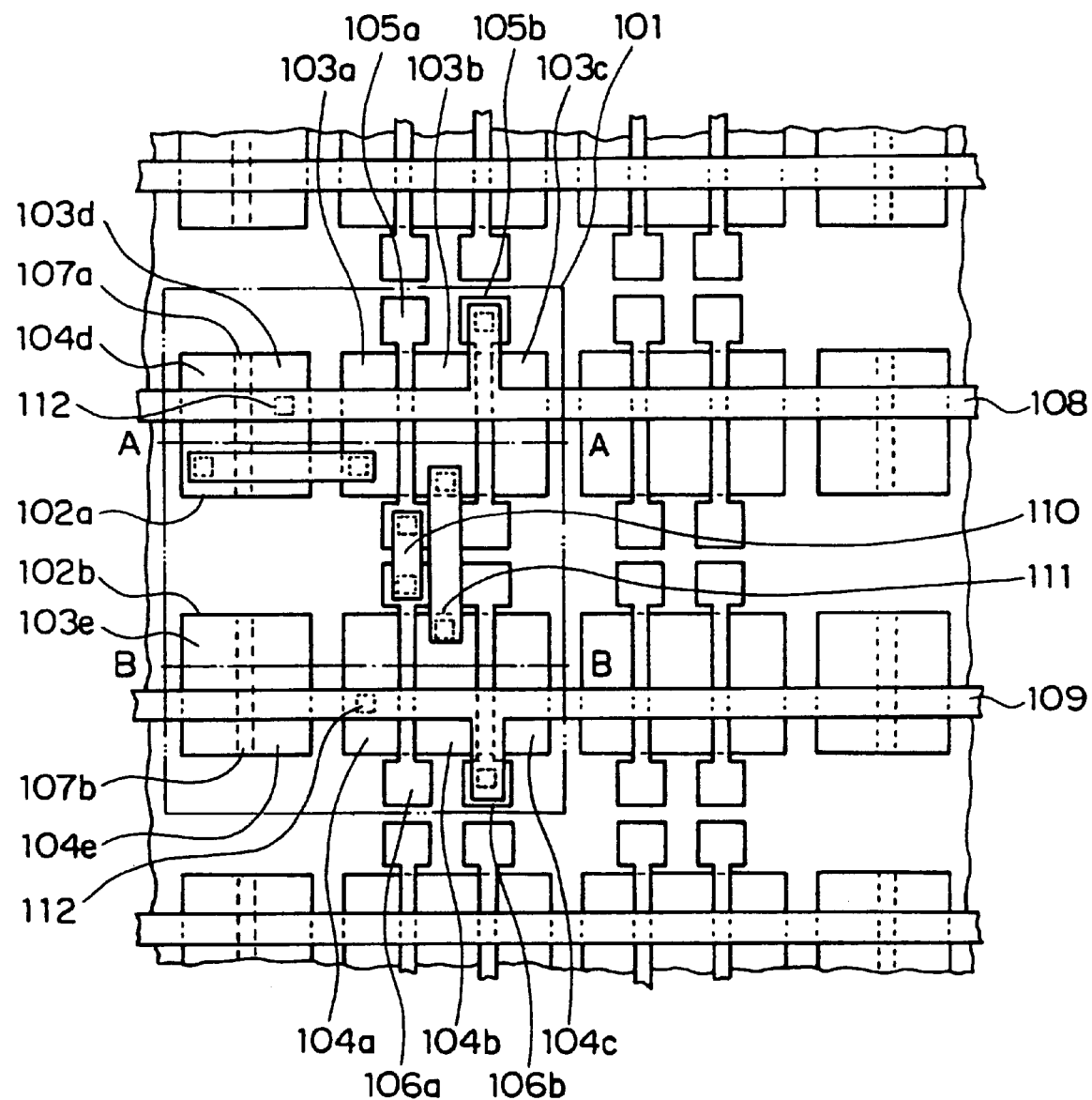
FIG. 7 is a plan view of a master slice semiconductor IC according to a first embodiment of the present invention.

Referring to FIG. 7, a master slice semiconductor IC according to an embodiment of the present invention comprises a plurality of basic cells arranged in a matrix. Each of the basic cell includes a pair of diodes 102a and 102b, a pair of pMOS transistors implemented by P$^+$-diffused regions 103a, 103b and 103c and pMOS gate electrodes 105a and 105b, and a pair of nMOS transistors implemented by N$^+$-diffused regions 104a, 104b and 104c and nMOS gate electrodes 106a and 106b. Diode 102a has an anode implemented by P$^+$-diffused region 103d and P$^-$-diffused region 107a and a cathode implemented by N$^+$-diffused region 104d. Diode 102b has an anode implemented by P$^+$-diffused region 103e and P$^-$-diffused region 107b and a cathode implemented by N$^+$-diffused region 104e.

Figure 8A:
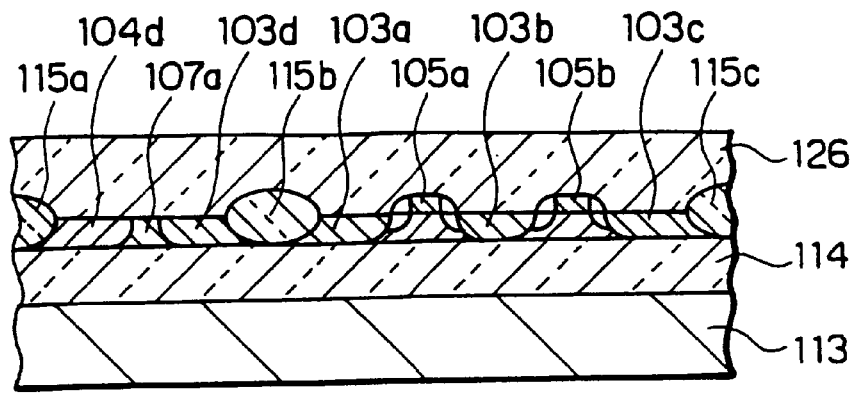
FIGS. 8A and 8B are sectional views taken along lines A—A and B—B, respectively.
Figure 8B:
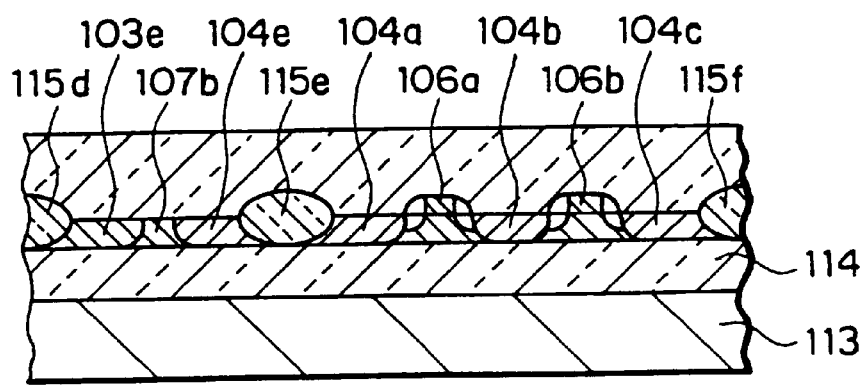

Referring to FIGS. 8A and 8B showing sectional views of the semiconductor IC of FIG. 7, the SOI substrate has a buried oxide film 114 on the P-type silicon substrate 113, and a silicon layer on the buried oxide film. The silicon layer can be separated into a plurality of cell regions by a field oxide film 115b generally formed by a LOCOS technique. The field oxide film also separates the diode from the functional cell portion. Specifically, P+-diffused region 103a of the pMOS transistor is separated from the anode of the diode implemented by P+-diffused region 103d by the field oxide film 115b interposed therebetween. The minimum width of the field oxide film 115b is defined by current LOCOS technology and can be formed below 1 μm in the 0.5 μm design rule for a gate width. Accordingly, the diode can be implemented with a higher integration density within a basic cell.

In FIG. 7, the anode of diode 102a implemented by P$^+$-diffused region 103d is applied with the source voltage via source line 108 and contact hole 112, the cathode of diode 102a implemented by N$^+$-diffused region 104 is coupled to P$^+$-diffused region 103a constituting the source of pMOS transistor 116 via a metallic line, the drain of pMOS transistor 116 implemented by P$^+$-diffused region 103b is coupled to N$^+$-diffused region 104b constituting the drain of nMOS transistor 117 via output line 111, the source of nMOS transistor 117 implemented by N$^+$-diffused region 104a is maintained at the ground potential by ground line 109 and contact hole 112, and pMOS gate electrode 105a and nMOS gate electrode 106a are coupled together via input line 110. The pMOS gate electrode 105b is maintained at the source potential by source line 108, and nMOS gate electrode 106b is maintained at the ground potential by line 109.

The configuration as described above provides the circuit configuration of FIG. 9, wherein pMOS transistor of a CMOS inverter has a source coupled to the cathode of diode 102a, the anode of which is coupled to source line 108 of the IC. In this configuration, since the diode 102a is forward biased between source line 108 and the source of pMOS transistor 116 of the CMOS inverter, the operational voltage of the CMOS inverter is reduced by the built-in voltage of the diode 102a to thereby reduce the source voltage and accordingly the power consumption of the CMOS inverter.

Assuming that source voltage Vdd=3.3 volts and built-in voltage of the diode Vfb=0.7 volts, the power consumption of the CMOS inverter is reduced down to the following rate:

$$Pr=\{(Vdd-Vfb)^2/Vdd^2\}\times 100=62\ (\%) \quad (2)$$

with respect to the case of using the source voltage Vdd. In a practical circuit, the total power consumption includes the power consumption of the diode in addition to the power consumption of the CMOS inverter. However, even if considering the power consumption of the diode, the total power consumption will be reduced down to as low as below 70% of a conventional CMOS inverter.

Figure 1:
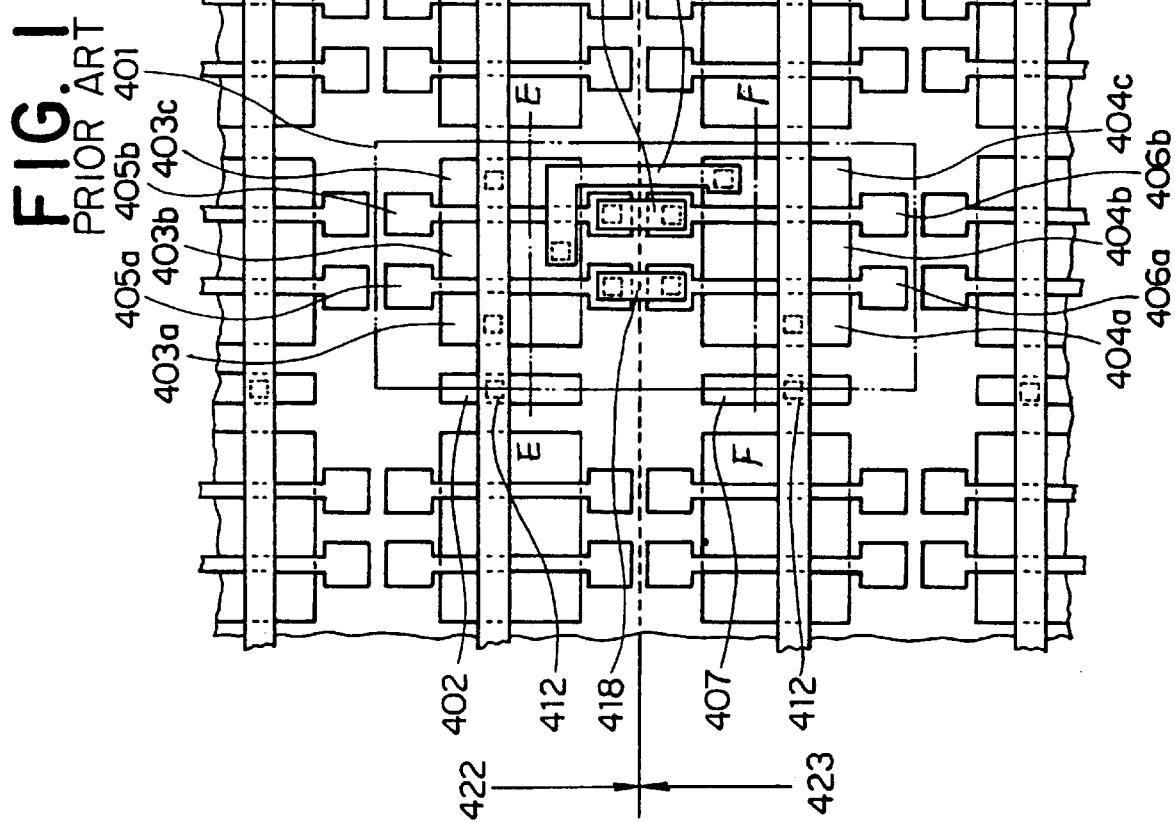
FIG. 1 is a plan view of a typical ASIC implemented by a CMOS SOG.
Figure 2A:
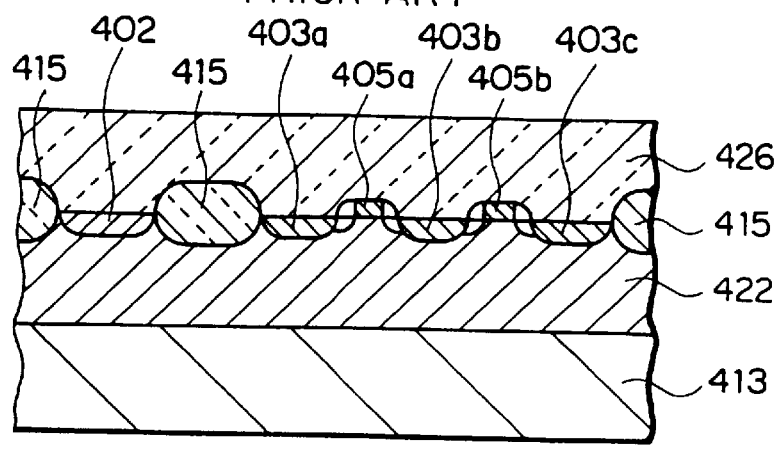
FIGS. 2A and 2B are sectional views taken along line E—E and F—F, respectively.
Figure 2B:
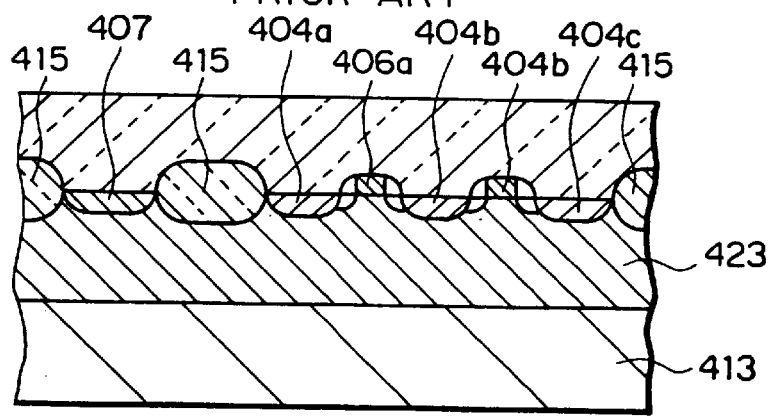
Figure 3:
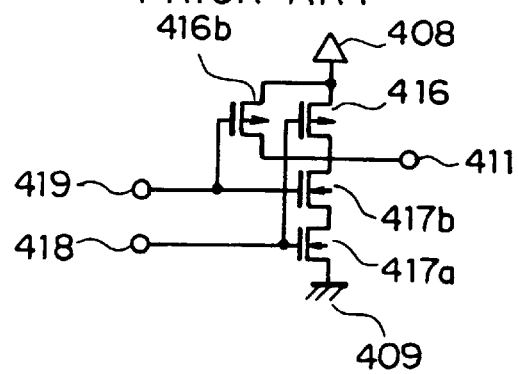
FIG. 3 is an equivalent circuit diagram of the basic cell in FIG. 1.
Figure 4A:
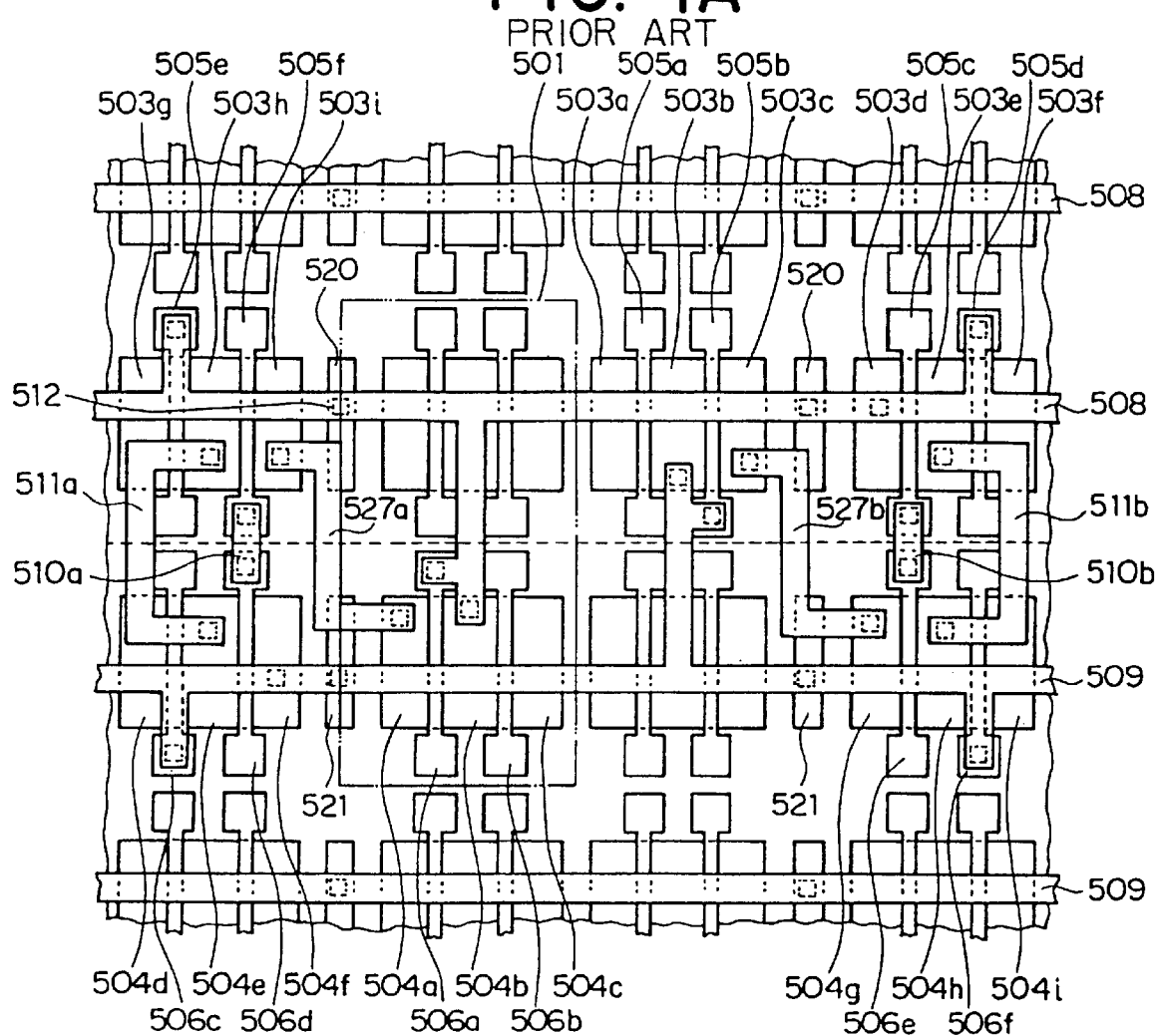
FIG. 4A is a plan view of a first conventional circuit arrangement applied to the ASIC of FIG. 1.
Figure 4B:
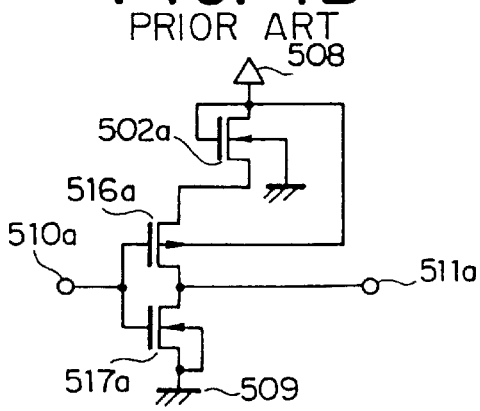
FIGS. 4B and 4C are equivalent circuit diagrams for the basic cell in FIG. 4A.
Figure 4C:
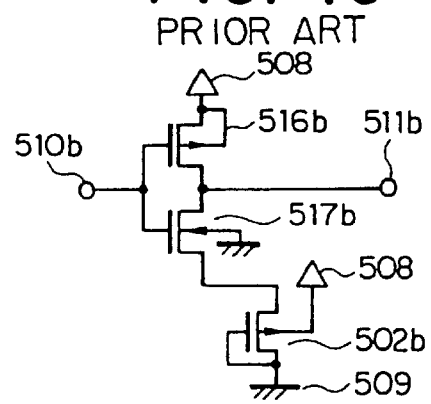
Figure 5A:
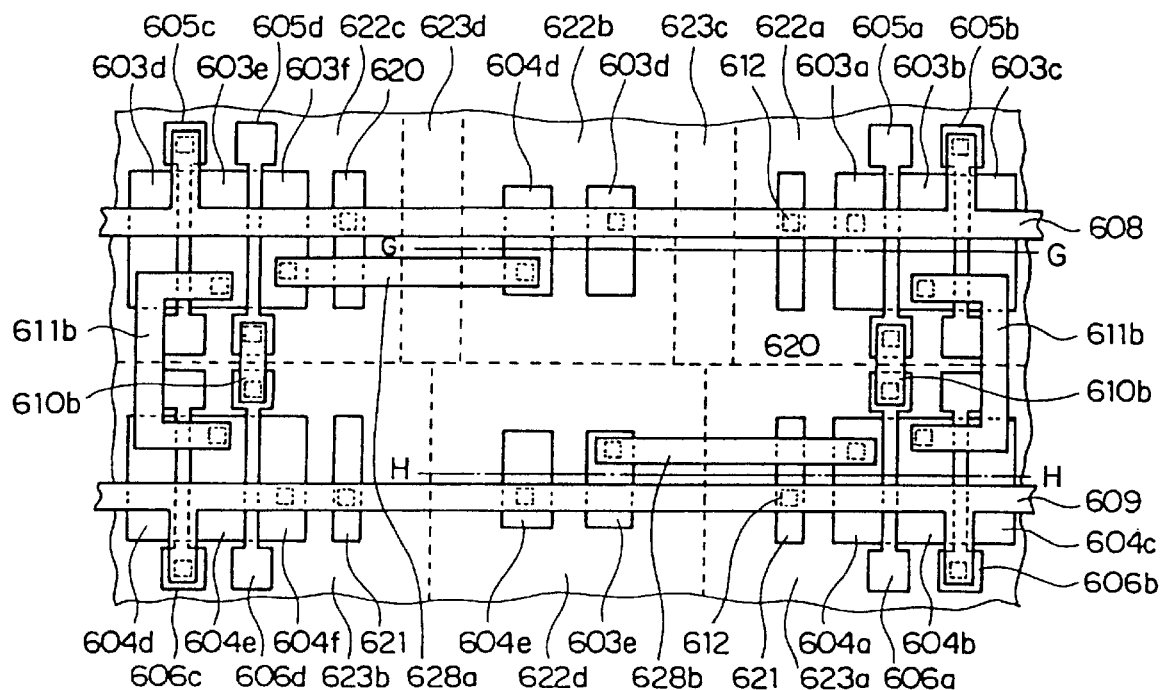
FIG. 5A is a plan view of a second conventional circuit including a twin-well CMOS.
Figure 5B:
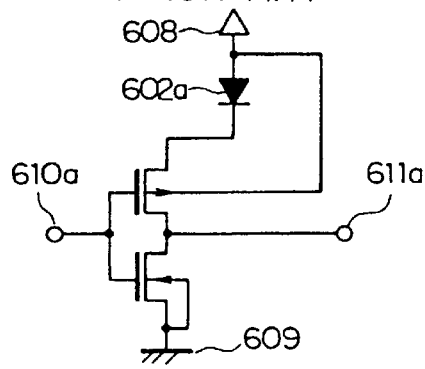
FIGS. 5B and 5C are equivalent circuit diagram of the basic cell in FIG. 5A.
Figure 5C:
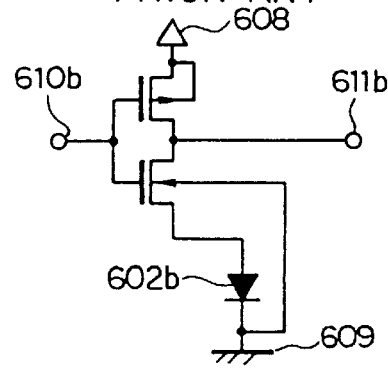
Figure 6A:
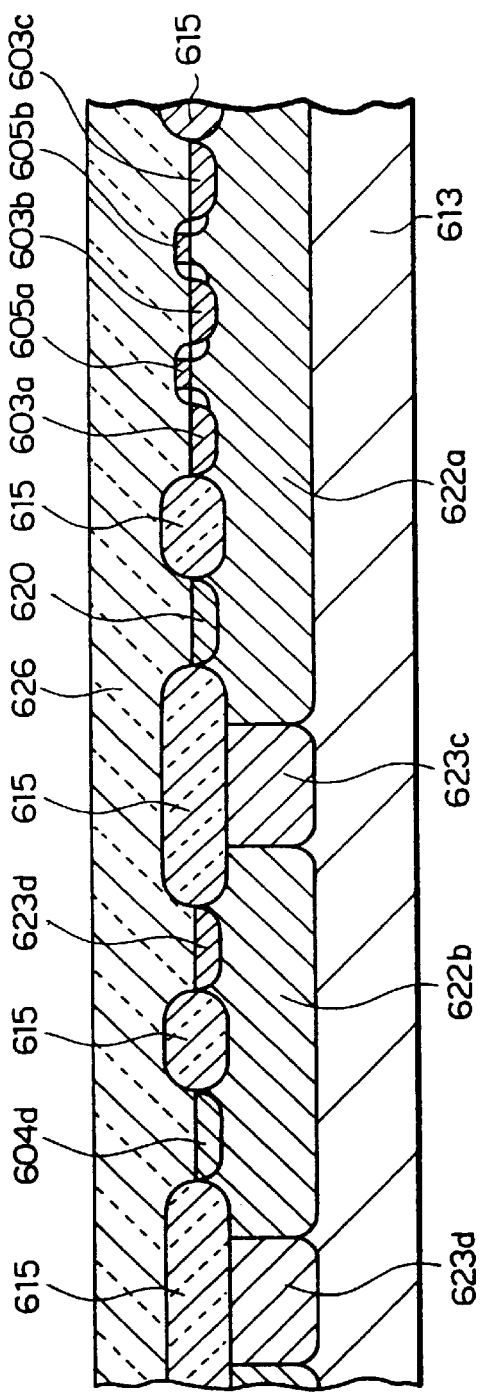
FIGS. 6A and 6B are sectional views taken along lines G—G and H—H, respectively.
Figure 6B:
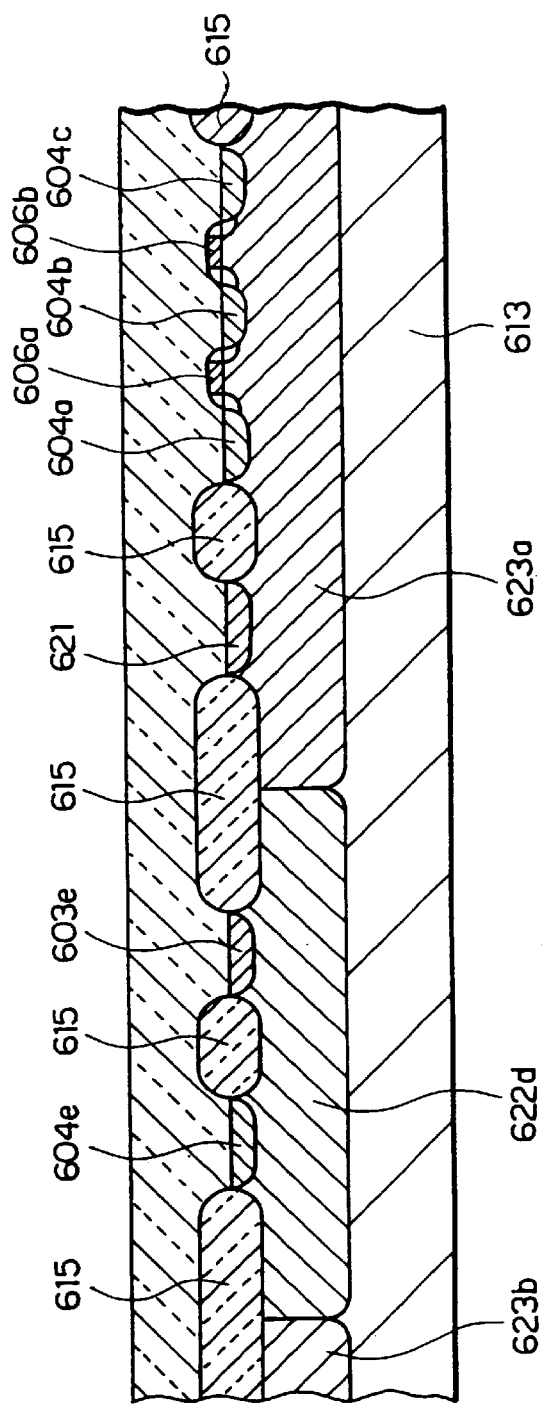
Figure 9:
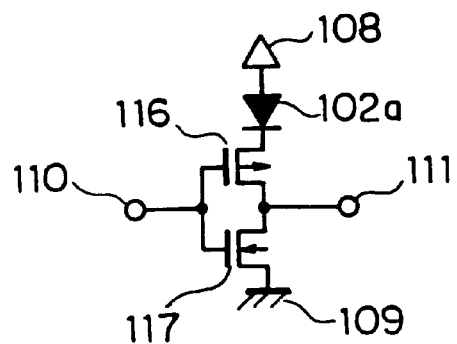
FIG. 9 is an equivalent circuit diagram of the basic cell in FIG. 7.

Comparison of FIGS. 7 and 9 against FIGS. 4A and 4B will show that the CMOS inverter according to the embodiment has a smaller occupied area than that of the known CMOS inverter. In addition, the diode of FIGS. 7 and 9 has a smaller parasitic capacitance, and accordingly, achieves a power reduction as well as a higher operational speed.

In a practical circuit of ASIC, the region for basic cells shown in FIG. 7 wherein a reduced source voltage is applied and the region for basic cells shown in FIG. 4A wherein a normal source voltage is applied maybe preferably separated from each other in a single chip area to obtain an effective power saving and reduced occupied area. In FIG. 9 and in the following equivalent circuit diagram, it will be noted that diode 102a etc. may be inserted between MOS transistor 116 etc. and output line 111 instead of the arrangement shown in the figure.

Figure 10A:
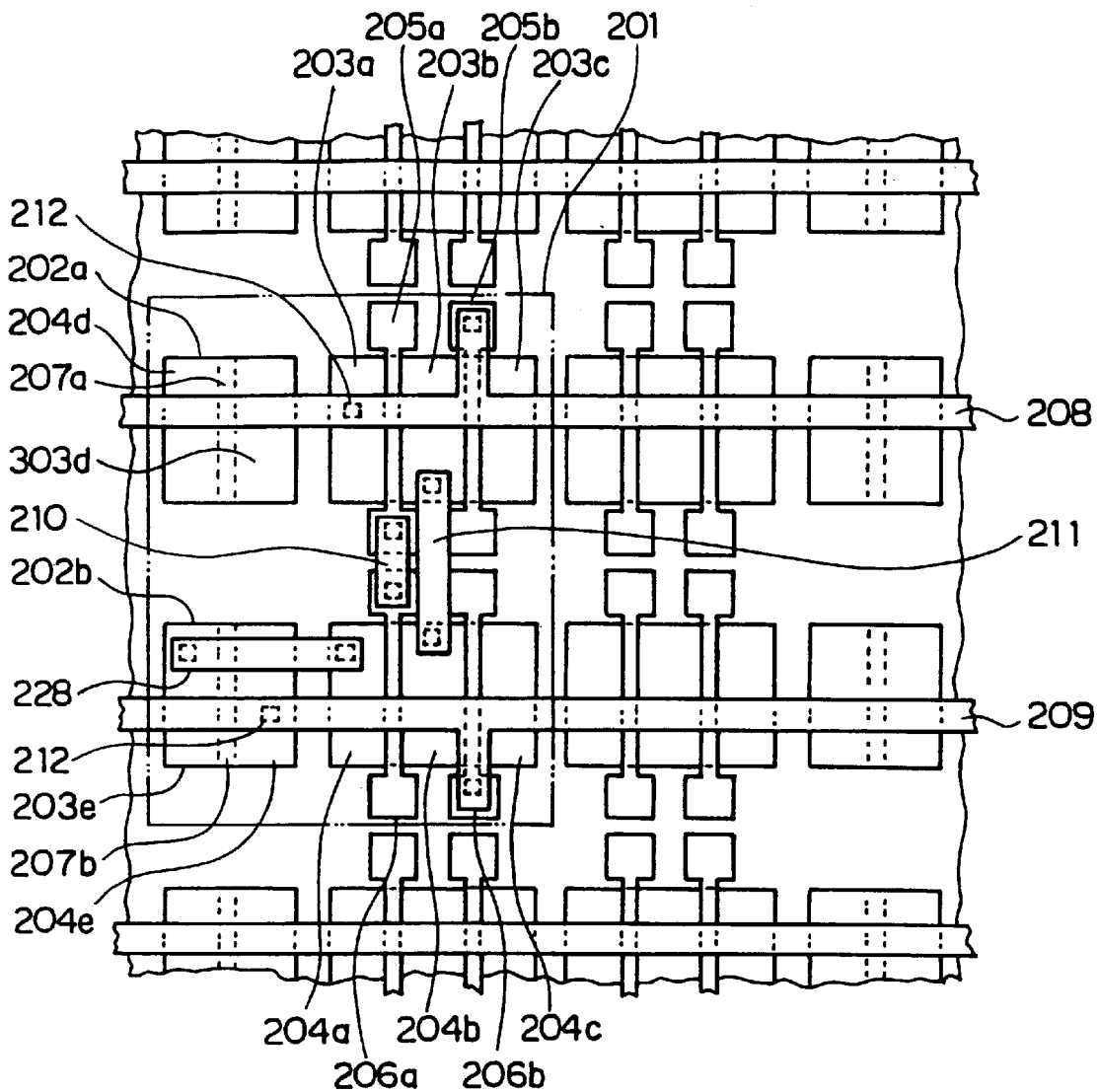
FIG. 10A is a plan view of a master slice IC according to a second embodiment of the present invention.
Figure 10B:
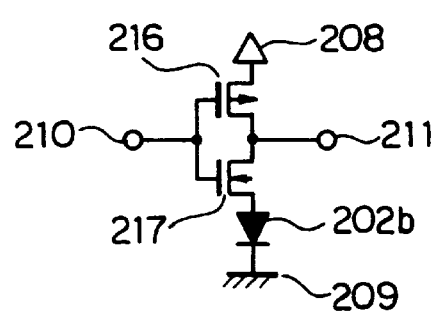
FIG. 10B is an equivalent circuit diagram of the basic cell in FIG. 10A.

Referring to FIGS. 10A and 10B showing, similarly to FIGS. 7 and 9, respectively, a master slice semiconductor IC according to a second embodiment of the present invention, a diode for power saving is interposed between a CMOS inverter and ground line. Specifically, in the present embodiment, the source of PMOS transistor 216 implemented by P$^+$-diffused region 203a is coupled to source line 208 via contact hole 212, the drain of pMOS transistor 216 implemented by P$^+$-diffused region 203b is coupled to the drain of nMOS transistor 217 implemented by N$^+$-diffused region 204b via output line 211, the source of nMOS transistor 217 implemented by N$^+$-diffused region 204a is coupled to the anode of diode 202b implemented by P$^+$-diffused region 203e via metallic line 228, the cathode of diode 202b is maintained at the ground potential by ground line 209 and contact hole 212, and pMOS gate electrode 205a and nMOS gate electrode 206a are coupled together via input line 210. The other pMOS gate electrode 205b and nMOS gate electrode 206b are maintained at the source potential and ground potential, respectively.

By the configuration as described above, the equivalent circuit shown in FIG. 10B can be obtained, wherein the source of nMOS transistor 217 of CMOS inverter is coupled to the anode of diode 202b, the cathode of which is connected to ground line 209 of the IC. Since diode 202b is forward biased between the source of nMOS transistor 217 of CMOS inverter and ground line 209 of the IC chip, the ground potential of the CMOS inverter is raised by built-in voltage of the diode 202b to thereby obtain a source voltage reduction and accordingly a power saving.

Figure 11:
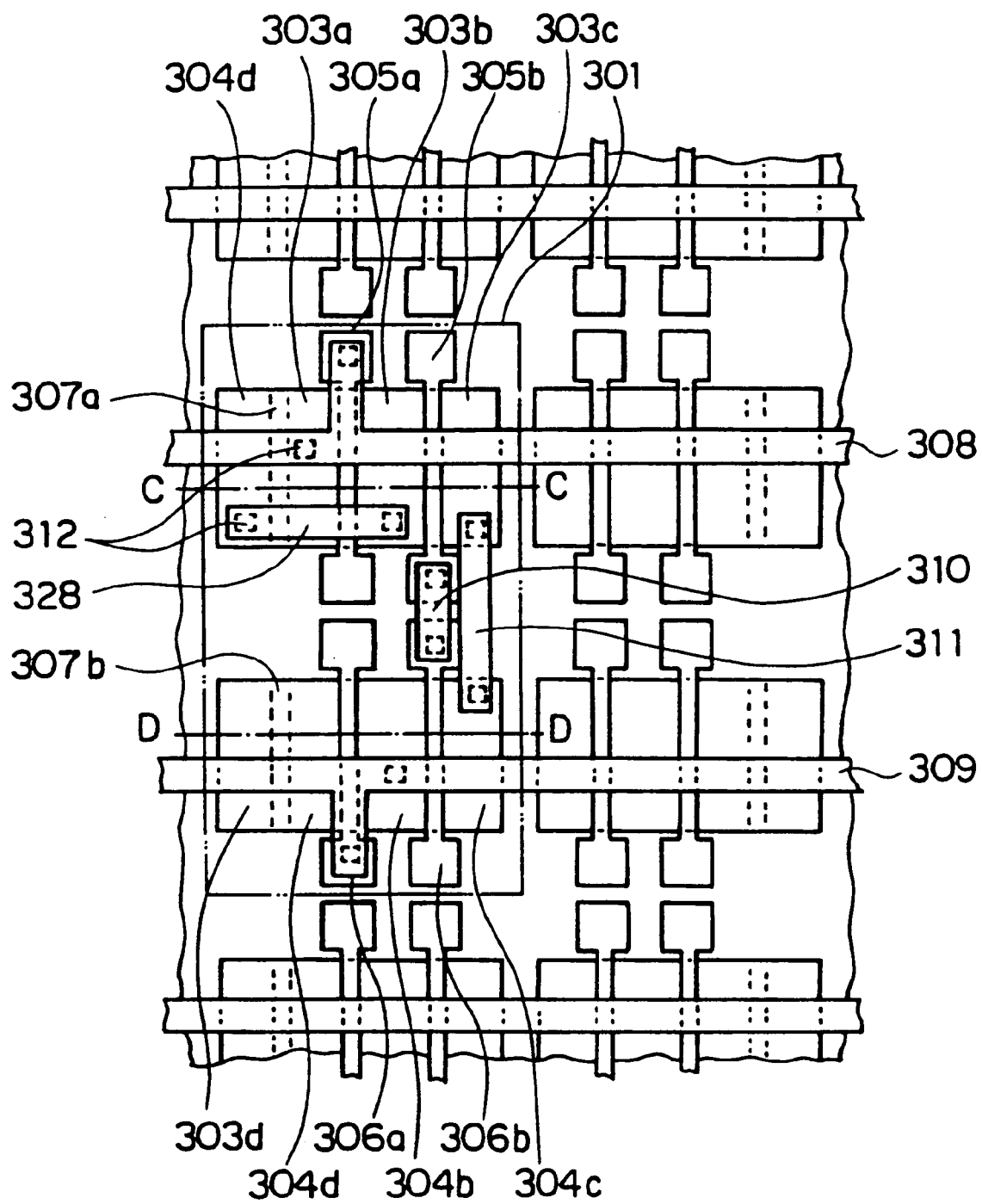
FIG. 11 is a plan view of a master slice IC according to a third embodiment of the present invention.
Figure 12A:
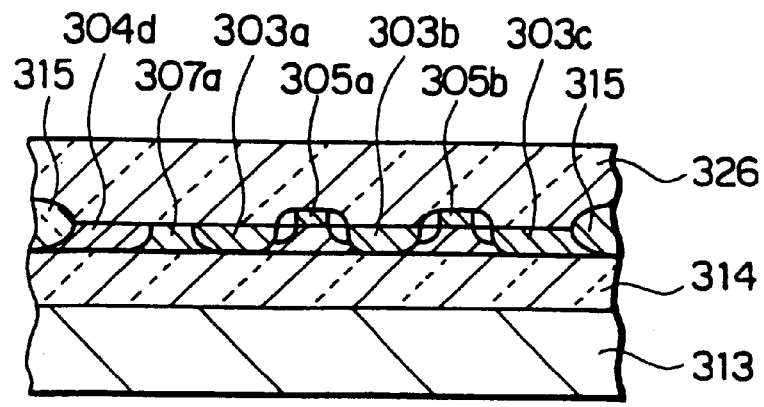
FIGS. 12A and 12B are sectional views taken along lines C—C and D—D, respectively.
Figure 12B:
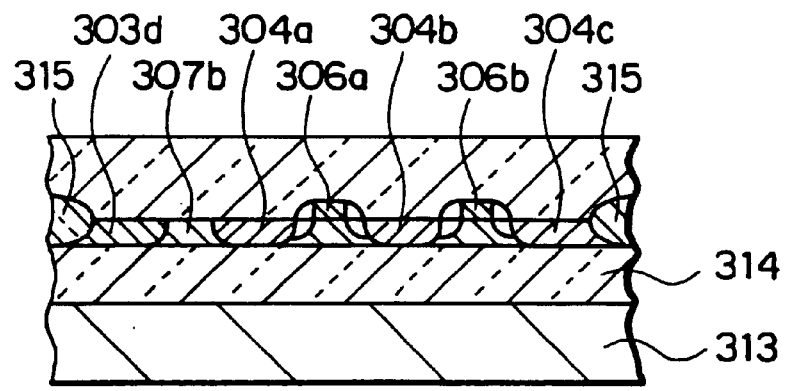
Figure 13:
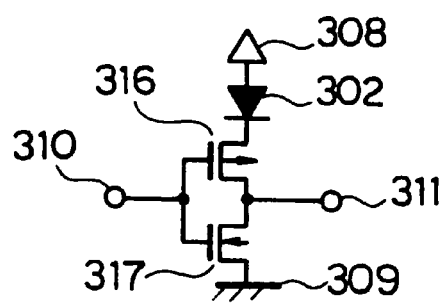
FIG. 13 is an equivalent circuit diagram of the basic cell in FIG. 11.

Referring to FIG. 11, showing a master slice semiconductor IC according to a third embodiment of the present invention, the anode of a diode is implemented by P$^+$-diffused region 303a constituting the source of the pMOS transistor and the cathode of the diode is implemented by N$^+$-diffused region 304a constituting the source of nMOS transistor. FIGS. 12A and 12b are sectional views taken along C—C and D—D lines, respectively, in FIG. 11, and FIG. 13 is an equivalent circuit of the basic cell shown in FIG. 11.

Specifically, as shown in FIG. 12A, the anode and cathode of the diode is implemented by P$^+$-diffused region 303a and N$^+$-diffused region 304d, respectively, sandwiching P⁻-diffused region 307a therebetween. P⁺-diffused region 303a constitutes the source of the pMOS transistor. Similarly, as shown in FIG. 12B, the anode and cathode of the diode are implemented by P⁺-diffused region 303d and N⁺-diffused region 304a, respectively, sandwiching P⁻-diffused region 307b therebetween. N⁺-diffused region 304a constitutes the source of nMOS transistor.

In the present embodiment, the element separation region is not necessary between the source of the pMOS transistor and the anode of the diode or between the source of the nMOS transistor and the cathode of the diode. Accordingly, the master slice semiconductor IC has a further reduced occupied area.

In the layout of FIG. 11, P⁺-diffused region 303a constituting the anode of the diode is applied with source voltage via source line 308 and contact hole 312, N⁺-diffused region 304d constituting the cathode of the diode is coupled to P⁺-diffused region 303b constituting the source of pMOS transistor 316 via metallic line 328, P⁺-diffused region 303c constituting the drain of pMOS transistor 316 is coupled to N⁺-diffused region 304c constituting the drain of nMOS transistor 317 via output line 311, N⁺-diffused region 304b constituting the source of nMOS transistor 317 is maintained at the ground potential by ground line 309 and contact hole 312, and pMOS gate electrode 305b and nMOS gate electrode 306b are coupled together via input line 310. The other pMOS gate electrode 305a and nMOS gate electrode 306a are maintained at the source potential by source line 308 and at the ground potential by ground line 309, respectively.

By the layout of FIG. 11, an equivalent circuit shown in FIG. 13 is obtained, wherein diode 302 is forward biased between source line 308 and the source of pMOS transistor 316 in the CMOS inverter. The circuit of FIG. 13 is equivalent to the circuit of FIG. 9 and also achieves both low power consumption and high operational speed.

In FIG. 11, P⁺-diffused region 303d and N⁺-diffused region 304a may be coupled to ground line 309. P⁻-diffused region may be replaced by N⁻-diffused region. A gate electrode applied with source voltage may be formed as overlying P⁻-diffused region 303d with an oxide film disposed therebetween. A gate electrode maintained at the ground potential may be formed as overlying N⁻-diffused region with an oxide film disposed therebetween. A circuit configuration similar to FIG. 10B can be also implemented by the present embodiment.

While the present invention is described as directed to a gate array, it may be directed to any master slice semiconductor IC such as a standard cell type IC having any basic cell or block. In addition, in the embodiments as described above, SOI substrate is used for the entire chip area. However, the master slice may be implemented on a part of a semiconductor substrate having a SOI region therein. The circuit may be an analog circuit instead of the digital circuit.

Although the present invention is described with reference to preferred embodiments thereof, the present invention is not limited thereto and various modifications or alterations can be easily made therefrom by those skilled in the art without departing from the scope of the present invention.

What is claimed is:

1. A master slice semiconductor integrated circuit (IC) comprising a substrate having a silicon on insulator (SOI) area including an insulator layer and a semiconductor layer formed on said insulator layer, a separating layer for separating said semiconductor layer into a plurality of cell regions, a basic cell disposed in each of said cell regions, and a pair of power supply lines for supplying electric power to said basic cell, said basic cell comprising a functional cell portion comprising at least one pMOS transistor and nMOS transistor, and the basic cell further comprising a first forward biased diode having one of its cathode and anode coupled to one of said power supply lines and the other of its cathode and anode coupled to said functional cell portion, the anode and the cathode of said first forward biased diode defining therebetween a first P-N junction extending between a top surface of said semiconductor layer and said insulator layer.

2. A master slice semiconductor IC as defined in claim 1 wherein said anode is implemented by a P-type conductive region constituting a source of said pMOS transistor.

3. A master slice semiconductor as defined in claim 1 wherein said cathode is implemented by a N-type conductive region constituting a source of said nMOS transistor.

4. A master slice semiconductor IC as defined in claim 1 wherein a plurality of said basic cell are arranged in a matrix.

5. A master slice semiconductor integrated circuit (IC) comprising a substrate having a silicon on insulator (SOI) area including an insulator layer and a semiconductor layer formed on said insulator layer, a separating layer for separating said semiconductor layer into a plurality of cell regions, a basic cell disposed in each of said cell regions, and a pair of power supply lines for supplying electric power to said basic cell, said basic cell comprising a functional cell portion and a first forward biased diode having one of its cathode and anode coupled to one of said power supply lines and the other of its cathode and anode coupled to said functional cell portion, the anode and the cathode of said first forward biased diode defining therebetween a first P-N junction extending between a top surface of said semiconductor layer and said insulator layer, said basic cell further comprising a second forward biased diode having one of its cathode and anode coupled to the other of said power supply lines and the other of its cathode and anode coupled to said functional cell portion, the anode and the cathode of the second forward biased diode defining therebetween a second P-N junction extending between the top surface of said semiconductor layer and said insulator layer.

6. A master slice semiconductor IC as defined in claim 5 wherein said functional cell portion includes at least one pMOS transistor and nMOS transistor.

7. A master slice semiconductor IC as defined in claim 6 wherein the anode of said first diode is implemented by a P-type conductive region constituting a source or drain of said pMOS transistor, and the cathode of said second diode is implemented by a N-type conductive region constituting a drain or source of said nMOS transistor.

8. A master slice semiconductor integrated circuit (IC) comprising a substrate having a silicon on insulator (SOI) area including an insulator layer and a semiconductor layer formed on said insulator layer, a separating layer for separating said semiconductor layer into a plurality of cell regions, a basic cell disposed in each of said cell regions, and a pair of power supply lines for supplying electric power to said basic cell, said basic cell comprising a functional cell portion and a first forward biased diode having one of its cathode and anode coupled to one of said power supply lines and the other of its cathode and anode coupled to said functional cell portion, the anode and the cathode of said first forward biased diode defining therebetween a first P-N junction extending between a top surface of said semiconductor layer and said insulator layer, and said functional cell portion comprising a NAND gate.

* * * * *